(12) United States Patent
Sakakibara et al.

(10) Patent No.: US 7,897,909 B2
(45) Date of Patent: Mar. 1, 2011

(54) SOLID-STATE IMAGE PICKUP DEVICE, A METHOD OF DRIVING THE SAME, A SIGNAL PROCESSING METHOD FOR THE SAME, AND IMAGE PICKUP APPARATUS

(75) Inventors: Masaki Sakakibara, Kanagawa (JP); Yusuke Oike, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/565,473

(22) Filed: Sep. 23, 2009

(65) Prior Publication Data
US 2010/0013976 A1 Jan. 21, 2010

Related U.S. Application Data

(62) Division of application No. 12/107,208, filed on Apr. 22, 2008, now Pat. No. 7,622,699.

(30) Foreign Application Priority Data

Apr. 23, 2007 (JP) .............................. 2007-112652

(51) Int. Cl.
*H01J 40/14* (2006.01)
(52) U.S. Cl. .............................. 250/214 R; 250/208.1
(58) Field of Classification Search .............. 250/208.1, 250/214 R, 214.1; 257/290–292, 440; 348/294–311
See application file for complete search history.

(56) References Cited

U.S. PATENT DOCUMENTS 5,172,249 A * 12/1992 Hashimoto .................. 358/482
6,850,278 B1 2/2005 Sakurai et al.

FOREIGN PATENT DOCUMENTS

JP 05-207375 8/1993

* cited by examiner

*Primary Examiner*—Que T Le
(74) *Attorney, Agent, or Firm*—SNR Denton US LLP

(57) ABSTRACT

A solid-state image pickup device including: a pixel array portion; a dummy pixel; a differential circuit; a reset voltage supplying section; and a common phase feedback circuit.

5 Claims, 12 Drawing Sheets

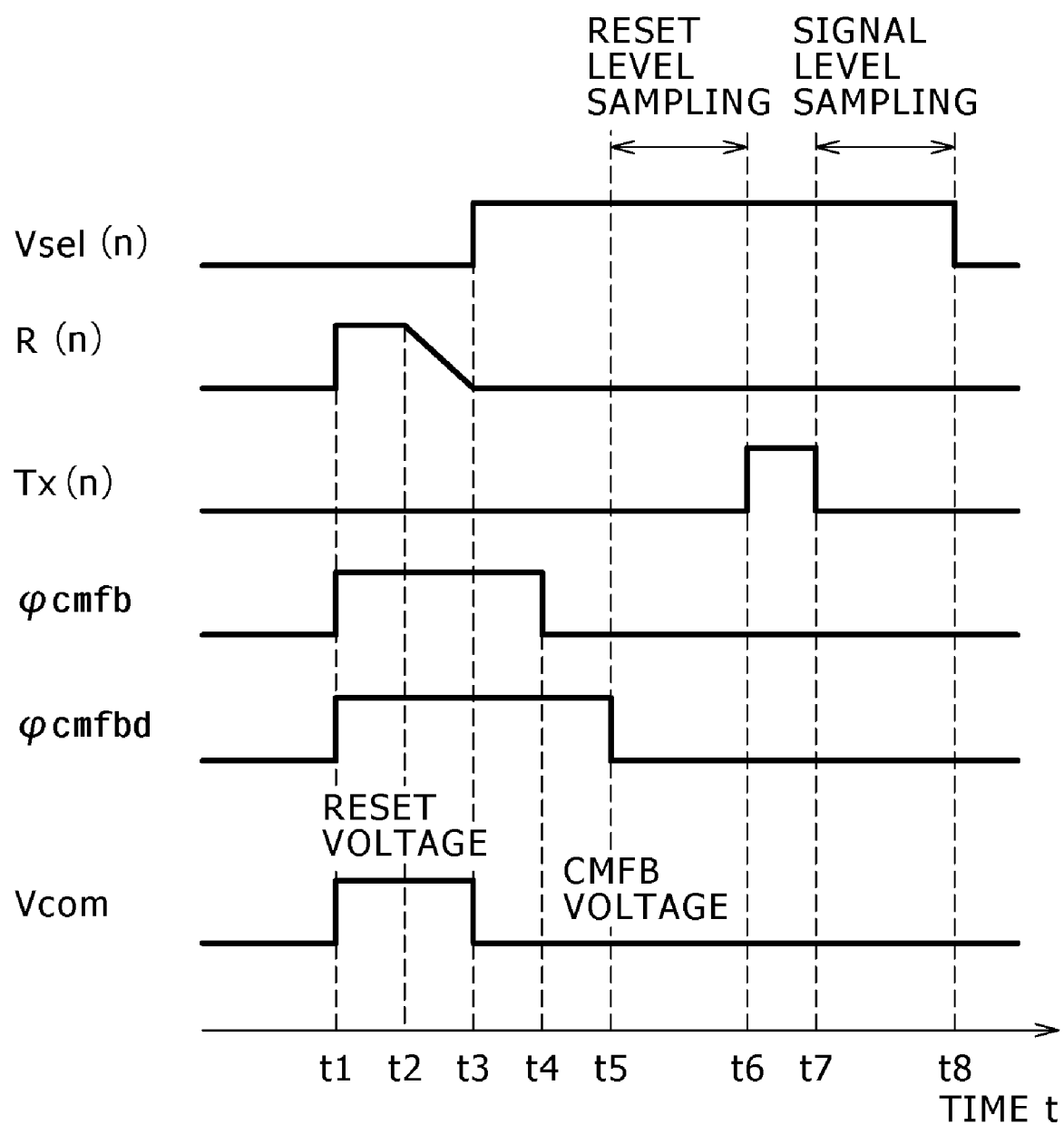

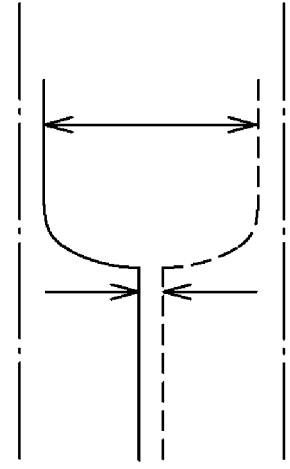
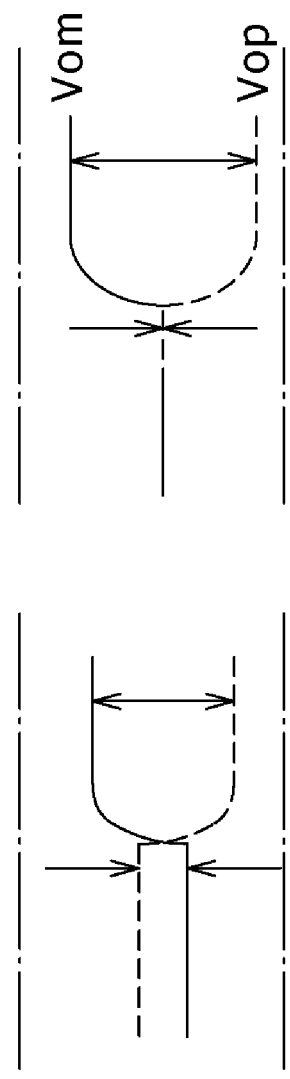

FIG. 7A

CASE WHERE CAPACITANCES ON UNIT PIXEL SIDE ARE SMALLER THAN THOSE ON DUMMY PIXEL SIDE (Cio_L<Cio_R, Cfd_L<Cfd_R)

$\Delta V \fallingdotseq \Delta Qsig/Cio\_R$

FIG. 7B

CASE WHERE THERE IS NO ERROR $\Delta V \fallingdotseq \Delta Qsig/Cio\_R$

FIG. 7C

CASE WHERE CAPACITANCES ON UNIT PIXEL SIDE ARE LARGER THAN THOSE ON DUMMY PIXEL SIDE (Cio_L>Cio_R, Cfd_L>Cfd_R)

$\Delta V \fallingdotseq \Delta Qsig/Cio\_R$

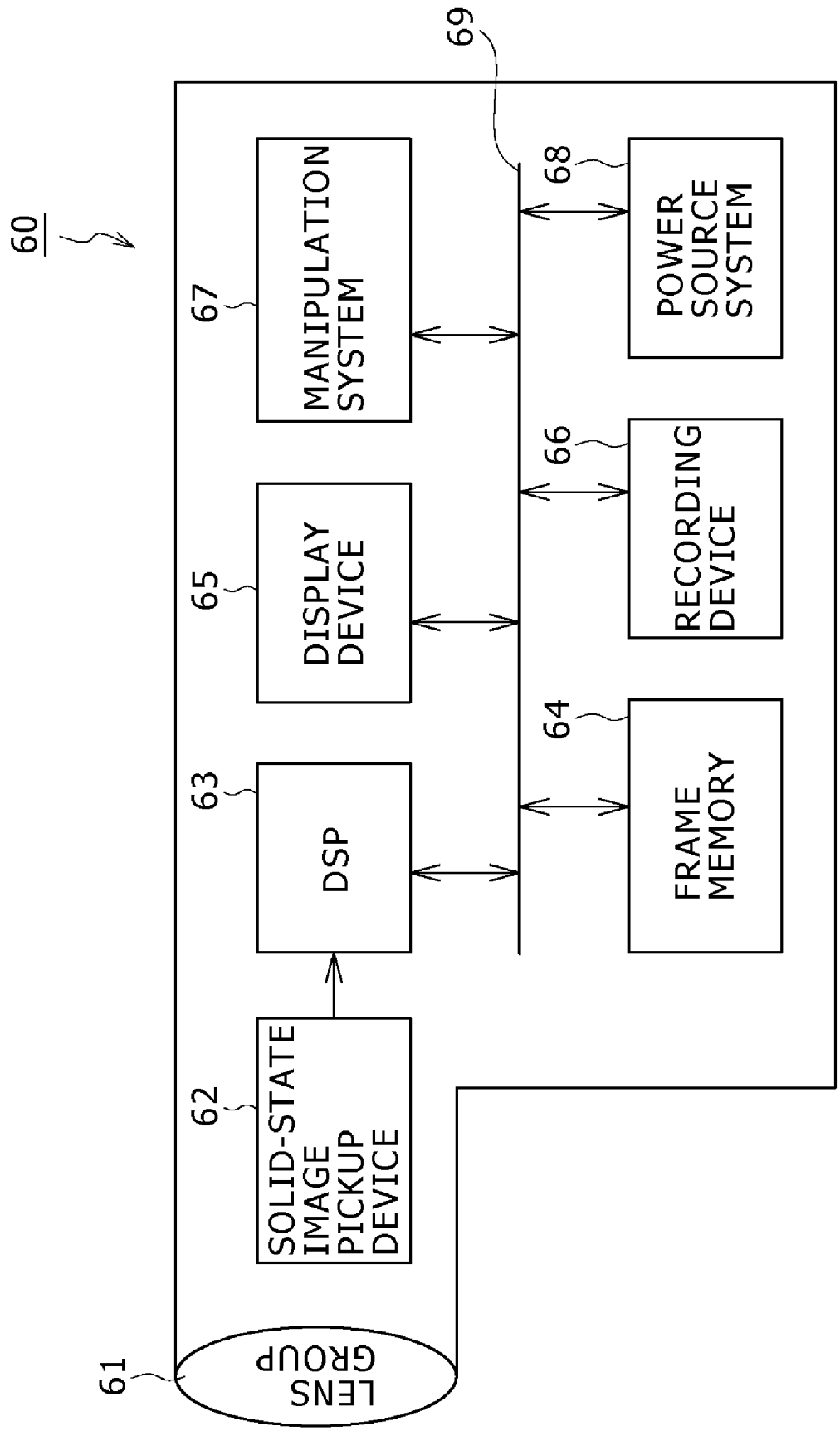

SOLID-STATE IMAGE PICKUP DEVICE, A METHOD OF DRIVING THE SAME, A SIGNAL PROCESSING METHOD FOR THE SAME, AND IMAGE PICKUP APPARATUS

This application is a divisional of U.S. patent application Ser. No. 12/107,208, filed Apr. 22, 2008, the entirety of which is incorporated herein by reference to the extent permitted by law. The present application claims the benefit of priority to Japanese Patent Application No. 2007-112652 filed in the Japan Patent Office on Apr. 23, 2007, the entirety of which is incorporated by reference herein to the extent permitted by law.

BACKGROUND OF THE INVENTION

The present invention relates to a solid-state image pickup device, a method of driving the same, a signal processing method for the same, and an image pickup apparatus.

In a solid-state image pickup device, signal charges generated in a photoelectric conversion portion (light receiving portion) are transferred to a floating diffusion capacitor, and are converted into a voltage in the floating diffusion capacitor to be read out to the outside. However, it has been difficult to ensure the sufficient signal charges along with the recent miniaturization of pixels. For this reason, it has been difficult to obtain an output voltage having a sufficient magnitude from each of the pixels.

The output voltage V from the pixel is expressed by V=Q/C where C is a signal detection capacitance and Q is a quantity of signal charges corresponding to a signal originating from a received light. Therefore, the small signal detection capacitor C makes it possible to increase the output voltage V, that is, enhance the sensitivity.

For this reason, heretofore, a photoelectric conversion element having an end grounded, a common source configuration amplification transistor, a capacitive element having a small capacitance, and a reset transistor constitute a pixel, thereby realizing a high-sensitivity signal output. Here, the common source configuration amplification transistor has a gate electrode connected to the other end of the photoelectric conversion element, a source electrode grounded, and a drain electrode connected to a load circuit. The capacitive element is connected between the drain electrode and the gate electrode of the common source configuration amplification transistor. Also, the reset transistor is connected in parallel with the capacitive element. This technique, for example, is described in a Patent Document 1 of Japanese Patent Laid-Open No. Hei 5-207375.

SUMMARY OF THE INVENTION

The technique described in the Patent Document 1 adopts a configuration in which no transfer path for the signal charges is provided inside the pixel. Thus, the output voltage has a level of a signal corresponding to a received light, and a reset level at which the signal is then reset in its level to be read out. Therefore, although it is possible to remove a fixed pattern noise due to a dispersion in threshold value of the amplification transistor, it may be impossible to suppress a reset noise generated in a phase of reset. This reset noise appears as a large noise in the pixel, relating to the related art technique described above, which outputs the signal at the high sensitivity.

On the other hand, providing a transfer transistor for transferring signal charges inside the pixel makes it possible to solve the problem involved in the related art described above. That is to say, providing the transfer transistor inside the pixel makes it possible that a correlated double sampling operation becomes possible in a subsequent stage since the pixel can be firstly reset, and the signal charges generated in the pixel can be then transferred. Also, carrying out the correlated double sampling operation makes it possible to suppress both the reset noise and the fixed pattern noise in the pixel.

Here, when the transfer transistor is provided inside the pixel, the signal charges are transferred to the floating diffusion capacitor by the transfer transistor. As a result, the signal charges can not be transferred from the photoelectric conversion element to the floating diffusion capacitor unless a potential of the photoelectric conversion element is higher than that of the floating diffusion capacitor.

The potential of the floating diffusion capacitor depends on a reset voltage applied to the floating diffusion capacitor in a reset operation in which a reset transistor is turned ON. However, in the pixel using the common source type amplification transistor, a node potential of the floating diffusion capacitor is set as low one (the potential is high) near a threshold voltage of the amplification transistor, and moreover the reset voltage is fixed at the vicinity of an operating point of the circuit. As a result, the potential of the floating diffusion capacitor can not be adjusted. From this reason, the signal charges can not be essentially transferred from the light receiving portion to the floating diffusion capacitor.

In the light of the foregoing, it is therefore desire to provide a solid-state image pickup device which is capable of readily realizing perfect transfer of signal charges from a light receiving portion to a floating diffusion capacitor in a unit pixel in which high-sensitivity signal output is realized by using a common source type amplification transistor and a capacitive element having a small capacitance, a method of driving the same, a signal processing method for the same, and an image pickup apparatus.

In order to attain the desire described above, according to an embodiment of the present invention, there is provided a solid-state image pickup device, including: a pixel array portion constituted by arranging unit pixels each including a photoelectric conversion element, a transfer transistor for transferring signal charges obtained through photoelectric conversion in the photoelectric conversion element to a floating diffusion capacitor, a reset transistor connected between the floating diffusion capacitor and an output node, a capacitive element having a minuter capacitance than that of the floating diffusion capacitance, the capacitive element being connected between the floating diffusion capacitor and the output node, and an amplification transistor for reading out a voltage signal obtained through conversion in the capacitive element; a dummy pixel having characteristics equal to those of the unit pixel, the dummy pixel being provided every pixel column of the pixel array portion; a differential circuit composed of the unit pixel and the dummy pixel; a reset voltage supplying section configured to supply a reset voltage to the reset transistor through the output node, the reset voltage supplying section being adapted to adjust a voltage value of the reset voltage; and a common phase feedback circuit for controlling a current source for the differential circuit so that a center of a difference between differential outputs from the differential circuit becomes a control voltage adjusted by an external voltage source after completion of a reset operation by the reset transistor.

According to the embodiment of the present invention, in the solid-state image pickup device having the configuration described above, adjusting the voltage value of the reset voltage makes it possible to freely set the potential of the floating diffusion capacitor. Thus, the potential design of the unit pixel is readily carried out, and the perfect transfer of the signal charges from the light receiving portion to the floating diffusion layer becomes possible. In addition, the current source for the differential circuit is controlled so that the center of the difference between the differential outputs from the differential circuit becomes the control voltage adjusted by the external voltage source, thereby making it possible to set an operating point of a gate portion of the amplification transistor so that the output amplitude becomes maximum. Thus, it is possible to widen the dynamic range.

According to another embodiment of the present invention, there is provided a method of driving a solid-state image pickup device including: a pixel array portion constituted by arranging unit pixels each including a photoelectric conversion element, a transfer transistor for transferring signal charges obtained through photoelectric conversion in the photoelectric conversion element to a floating diffusion capacitor, a reset transistor connected between the floating diffusion capacitor and an output node, a capacitive element having a minuter capacitance than that of the floating diffusion capacitance, the capacitive element being connected between the floating diffusion capacitor and the output node, and an amplification transistor for reading out a voltage signal obtained through conversion in the capacitive element; a dummy pixel having characteristics equal to those of the unit pixel, the dummy pixel being provided every pixel column of the pixel array portion; and a differential circuit composed of the unit pixel and the dummy pixel, the driving method including the steps of: making a voltage value of a reset voltage supplied to the reset transistor through the output node variable; and controlling a current source for the differential circuit so that a center of a difference between differential outputs from the differential circuit becomes a control voltage adjusted by an external voltage source after completion of a reset operation by the reset transistor.

According to still another embodiment of the present invention, there is provided a signal processing method for a solid-state image pickup device including: a pixel array portion constituted by arranging unit pixels each including a photoelectric conversion element, a transfer transistor for transferring signal charges obtained through photoelectric conversion in the photoelectric conversion element to a floating diffusion capacitor, a reset transistor connected between the floating diffusion capacitor and an output node, a capacitive element having a minuter capacitance than that of the floating diffusion capacitance, the capacitive element being connected between the floating diffusion capacitor and the output node, and an amplification transistor for reading out a voltage signal obtained through conversion in the capacitive element; a dummy pixel having characteristics equal to those of the unit pixel, the dummy pixel being provided every pixel column of the pixel array portion; and a differential circuit composed of the unit pixel and the dummy pixel, the signal processing method including the steps of: obtaining inverse numbers of outputs from the unit pixels when the same input is given to the unit pixels of the pixel array portion in a form of correction coefficients; and correcting a sensitivity dispersion among the pixels by using the correction coefficients.

According to yet another embodiment of the present invention, there is provided a signal processing method for a solid-state image pickup device including: a pixel array portion constituted by arranging unit pixels each including a photoelectric conversion element, a transfer transistor for transferring signal charges obtained through photoelectric conversion in the photoelectric conversion element to a floating diffusion capacitor, a reset transistor connected between the floating diffusion capacitor and an output node, a capacitive element having a minuter capacitance than that of the floating diffusion capacitor, the capacitive element being connected between the floating diffusion capacitor and the output node, and an amplification transistor for reading out a voltage signal obtained through conversion in the capacitive element; a dummy pixel having characteristics equal to those of the unit pixel, the dummy pixel being provided every pixel column of the pixel array portion; and a differential circuit composed of the unit pixel and the dummy pixel, the signal processing method including the steps of: gradually increasing a voltage value of a transfer control signal in accordance with which the transfer transistor is driven, and transferring the signal charges generated in the photoelectric conversion element for a accumulation period of time of one unit in plural batches; and adding the signals outputted from the unit pixels by plural transfer operations.

According to a further embodiment of the present invention, there is provided an image pickup apparatus, including; a solid-state image pickup device including: a pixel array portion constituted by arranging unit pixels each including a photoelectric conversion element, a transfer transistor for transferring signal charges obtained through photoelectric conversion in the photoelectric conversion element to a floating diffusion capacitor, a reset transistor connected between the floating diffusion capacitor and an output node, a capacitive element having a minuter capacitance than that of the floating diffusion capacitance, the capacitive element being connected between the floating diffusion capacitor and the output node, and an amplification transistor for reading out a voltage signal obtained through conversion in the capacitive element; and an optical system for focusing an incident light onto an imaging area of the solid-state image pickup device; in which the solid-state image pickup device includes: a dummy pixel having characteristics equal to those of the unit pixel, the dummy pixel being provided every pixel column of the pixel array portion; a differential circuit composed of the unit pixel and the dummy pixel; a reset voltage supplying section configured to supply a reset voltage to the reset transistor through the output node, the reset voltage supplying section being adapted to adjust a voltage value of the reset voltage; and a common phase feedback circuit for controlling a current source for the differential circuit so that a center of a difference between differential outputs from the differential circuit becomes a control voltage adjusted by an external voltage source after completion of a reset operation by the reset transistor.

According to an embodiment of the present invention, in the unit pixel in which the high-sensitivity signal output is realized by using the common source type amplification transistor and the capacitive element having the minute capacitance, the potential of the floating diffusion capacitor can be freely set. Consequently, it is possible to realize the perfect transfer of the signal charges from the light receiving portion to the floating diffusion layer.

BRIEF DESCRIPTION OF THE DRAWINGS

FIG. 6 is a timing waveform chart explaining operations of the unit pixel, the dummy pixel, and the common phase feedback circuit;

FIGS. 7A to 7C are respectively waveform charts when a dispersion in characteristics occurs on a unit pixel side and on a dummy pixel side;

FIG. 12 is a block diagram showing a configuration of an image pickup apparatus according to an embodiment of the present invention.

DETAILED DESCRIPTION OF THE PRESENTLY PREFERRED EMBODIMENTS

Preferred embodiments of the present invention will be described in detail hereinafter with reference to the accompanying drawings.

Figure 1:
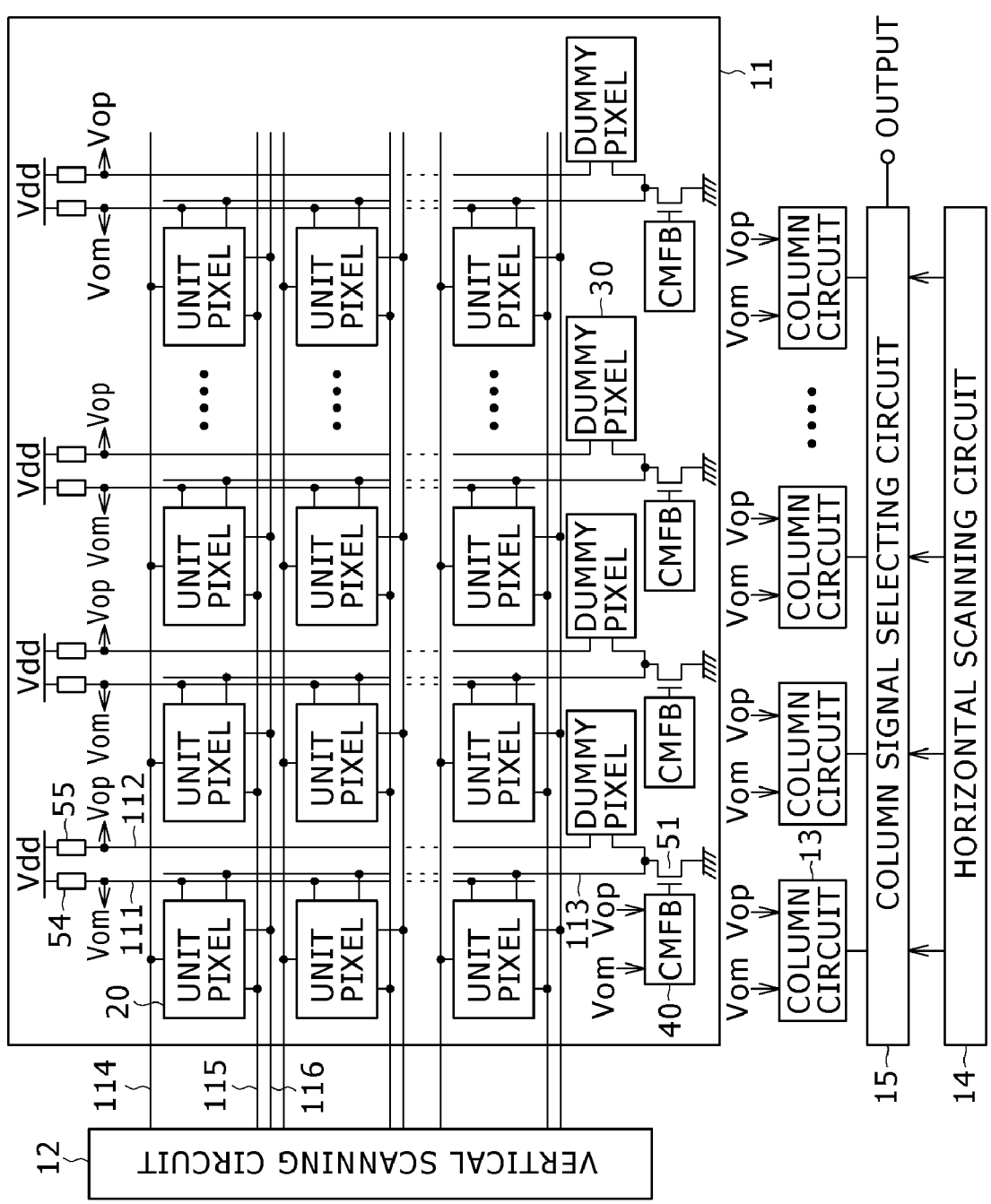
FIG. 1 is a system configuration diagram showing a configuration of a CMOS image sensor according to an embodiment of the present invention.

FIG. 1 is a system configuration diagram showing a configuration of a solid-state image pickup device, for example, a CMOS image sensor according to an embodiment of the present invention.

As shown in FIG. 1, a CMOS image sensor 10 of this embodiment includes a pixel array portion 11, and its peripheral circuit. In this case, the pixel array portion 11 is configured such that unit pixels each including a photoelectric conversion element (hereinafter simply referred to as "a pixel" in some cases) 20 are two-dimensionally arranged in matrix. A vertical scanning circuit 12, a plurality of column circuits 13, a horizontal scanning circuit 14, a column signal selecting circuit 15 and the like are provided as the peripheral circuit of the pixel array portion 11.

For the matrix arrangement of the unit pixels 20 in the pixel array portion 11, two signal lines 111 and 112, and a source line 113 are wired every pixel column. Also, a dummy pixel 30 having the same characteristics as those of the unit pixel 20, and a common phase feedback circuit (CMFD) 40 are provided every pixel column. The unit pixel 20 and the dummy pixel 30 compose a differential circuit. The details of the differential circuit will be described later. Moreover, drive control lines, for example, a transfer control line 114, a reset control line 115, and a selection control line 116 are wired every pixel row in the pixel array portion 11.

The vertical scanning circuit 12 is constituted by a shift register, an address decoder or the like. In addition, while vertically scanning the pixels 20 of the pixel array portion 11 in units of rows with respect to each of the electronic shutter rows and the read-out rows, the vertical scanning circuit 12 carries out an electronic shutter operation for sweeping off the signals from corresponding ones of the pixels 20 belonging to the electronic shutter row, and carries out a reading-out operation for reading out the signals from corresponding ones of the pixels 20 belonging to the read-out row.

Although an illustration is omitted here, the vertical scanning circuit 12 includes a reading-out scanning system, and an electronic shutter scanning system. In this case, the reading-out scanning system carries out the reading-out operation for reading out the signals from the pixels 20 belonging to the read-out row while successively selecting the pixels 20 in units of the rows. Also, the electronic shutter scanning system carries out the electronic shutter operation for the same row (electronic shutter row) before the reading-out scanning by the reading-out scanning system by a period of time corresponding to a shutter speed.

Also, a period of time ranging from a first timing to a second timing becomes a accumulation period of time (exposure period of time) of one unit for the signal charges in each of the pixels 20. Here, at the first timing, the unnecessary charges in the photoelectric conversion portion are reset through the shutter scanning by the electronic shutter scanning system. Also, at the second timing, the signals are read out from the pixels, respectively, through the reading-out scanning by the reading-out scanning system. That is to say, the electronic shutter operation means an operation for resetting (sweeping off) the signal charges accumulated in the photoelectric conversion portion, and starting to newly accumulate the signal charges after completion of the reset of the signal charges.

A plurality of column circuits 13 are arranged, for example, every pixel column of the pixel array portion 11, that is, arranged to show one-to-one correspondence relationship with the pixel columns. Also, the plurality of column circuits 13 execute predetermined signal processing for the pixel signals outputted from the pixels 20, respectively, belonging to the read-out column selected through the vertical scanning by the vertical scanning circuit 12, and temporarily hold therein the pixel signals obtained through the predetermined signal processing.

A circuit configuration composed of a sample and hold circuit for sampling and holding a pixel signal, or a circuit configuration composed of a noise removing circuit, including a sample and hold circuit, for removing a reset noise or a fixed pattern noise inherent in a pixel owing to a dispersion in threshold in an amplification transistor or the like by executing correlated double sampling (CDS) processing, or the like is used for the column circuit 13.

However, the circuit configuration described above is merely an example, and thus the present invention is by no means limited thereto. For example, it is also possible to adopt a circuit configuration such that the column circuit 13 is given an analog-to-digital (A/D) conversion function so that a pixel signal having a predetermined level is outputted in the form of a digital signal.

The horizontal scanning circuit 14 is constituted by a shift register, an address decoder or the like. The horizontal scanning circuit 14 successively scans the column circuits 13 which hold therein the pixel signals, obtained through the signal processing, in correspondence to the pixel columns of the pixel array portion 11, horizontally.

The column signal selecting circuit 15 is composed of a horizontal selection switch, a horizontal signal line, and the like. The column signal selecting circuit 15 successively outputs the pixel signals which are held in the column circuits 13 in correspondence to the pixel rows of the pixel array portion 11 synchronously with the horizontal scanning by the horizontal scanning circuit 14.

It is noted that a timing signal and a control signal each of which becomes a reference for operations of the vertical scanning circuit 12, the column circuit 13, the horizontal scanning circuit 14 and the like are generated by a timing control circuit (not shown).

In the CMOS image sensor 10 having the configuration described above, the various signal processing such as the CDS processing for the pixel signals outputted from the unit pixels 20, respectively, is executed in the column circuits 13, respectively. However, it is also possible to adopt a configuration such that the various signal processing for the pixel signals is executed by a signal processing circuit (not shown) disposed on a subsequent stage side of the column signal selecting circuit 15. In this case, the signal processing circuit may be mounted to the same semiconductor substrate as that of the pixel array portion 11 or may be disposed outside the semiconductor substrate.

(Unit Pixel and Dummy Pixel)

Figure 2:
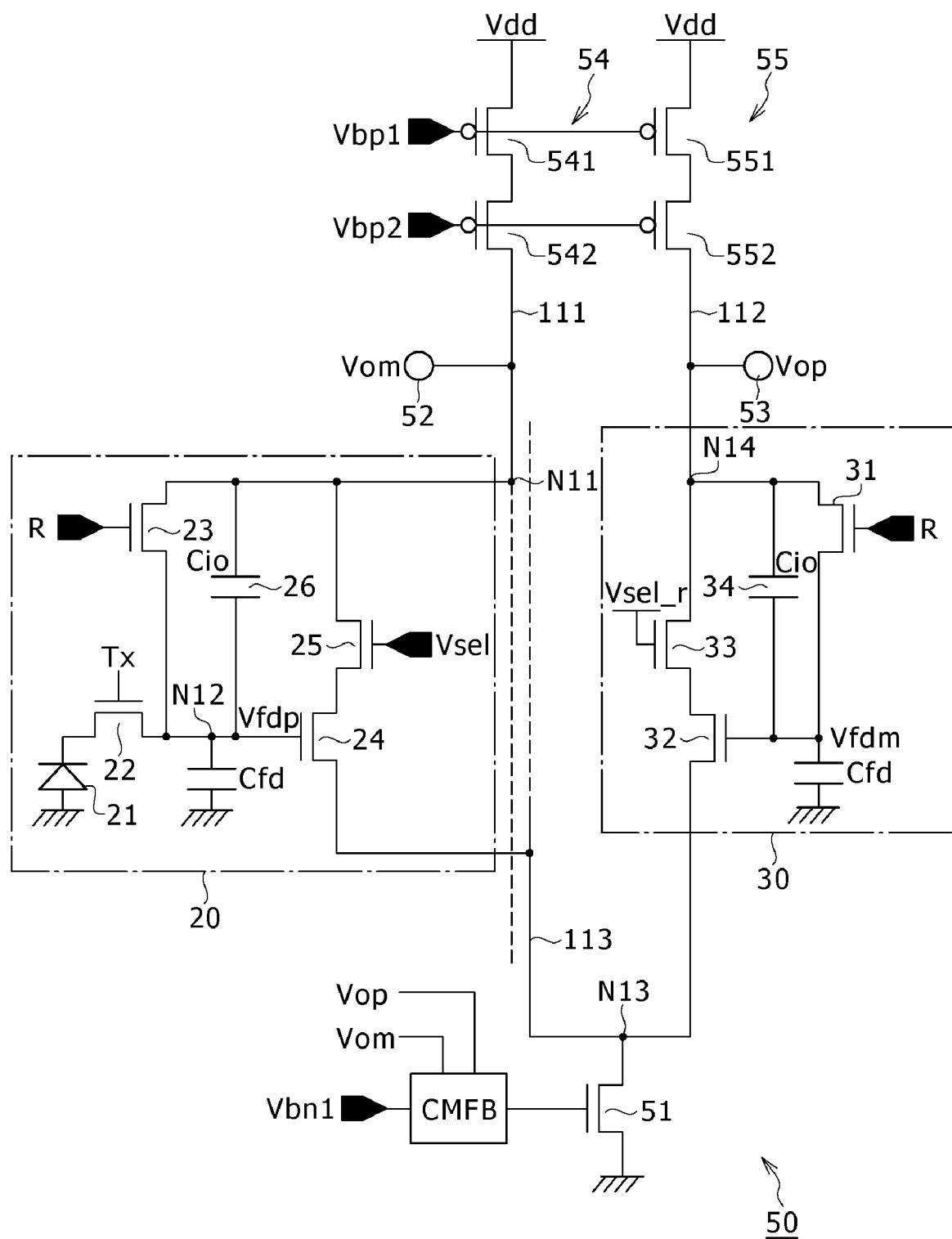
FIG. 2 is a circuit diagram showing an example of configurations of a init pixel and a dummy pixel shown in FIG. 1.

FIG. 2 is a circuit diagram showing an example of configurations of the unit pixel 20 and the dummy pixel 30 shown in FIG. 1.

The unit pixel 20 of this example is configured as a pixel circuit including four transistors, for example, a transfer transistor (transfer gate) 22, a reset transistor 23, an amplification transistor 24, and a selection transistor 25, and a capacitive element 26 in addition to a photoelectric conversion element 21 such as a photodiode. In this case, although N-channel MOS transistors, for example, are used as the four transistors 22 to 25, the present invention is by no means limited thereto.

One end (anode electrode) of the photoelectric conversion element 21 is grounded. The transfer transistor 22 is connected between the other end (cathode electrode) of the photoelectric conversion element 21 and a floating diffusion capacitor Cfd. A received light is subjected to the photoelectric conversion in the photoelectric conversion element 21 to turn into the signal charges (the electrons in this case). Thus, the signal charges are accumulated in the photoelectric conversion element 21. The signal charges thus accumulated are transferred to the floating diffusion capacitor Cfd serving as a charge-to-voltage conversion portion in accordance with a transfer control signal Tx supplied to a gate electrode (control electrode) of the transfer transistor 22.

A drain electrode of the reset transistor 23 is connected to an output node N11 of the pixel, and a source electrode thereof is connected to the floating diffusion capacitor Cfd. Prior to the transfer of the signal charges from the photoelectric conversion element 21 to the floating diffusion capacitor Cfd, the reset transistor 23 resets a potential (node potential) at a node N12 of the floating diffusion capacitor Cfd in accordance with a reset control signal R supplied to its gate electrode.

The amplification transistor 24 is of a common source configuration in which a gate electrode is connected to the floating diffusion capacitor Cfd, and a drain electrode is connected to the output node N11. The amplification transistor 24 reads out the potential of the floating diffusion capacitor Cfd, after being reset by the reset transistor 23, in the form of a reset level, and also reads out a potential of the floating diffusion capacitor Cfd, after the signal charges are transferred to the floating diffusion capacitor Cfd by the transfer transistor 22, in the form of a signal level.

For example, a drain electrode of the selection transistor 25 is connected to the output node N11, and a source electrode thereof is connected to the drain electrode of the amplification transistor 24. The selection transistor 25 is turned ON by applying a selection control signal Vsel to its gate electrode, thereby selecting the unit pixel 20 synchronously with the vertical scanning by the vertical scanning circuit 12. The selection transistor 25 can also adopt a configuration of being connected between the source electrode of the amplification transistor 24 and the source line 113.

The capacitive element 26 has a minuter capacitance Cio than that of the floating diffusion capacitor Cfd. One end of the capacitive element 26 is connected to the output node N11, and the other end thereof is connected to the gate electrode of the amplification transistor 24. The capacitive element 26 may be a parasitic capacitance between the gate electrode (the node N12 of the floating diffusion capacitor Cfd) of the amplification transistor 24, and the output node N11.

The dummy pixel 30, for example, is composed of a reset transistor 31, an amplification transistor 32, a selection transistor 33, and a capacitive element 34. These constituent elements 31 to 34 correspond to the reset transistor 23, the amplification transistor 24, the selection transistor 25 and the capacitive element 26 of the unit pixel 20, respectively.

The dummy pixel 30 is formed within the pixel array portion 11 in the same process as that for the unit pixel 20, thereby making it possible to equalize the characteristics of the dummy pixel 30 to those of the unit pixel 20. Here, a gate potential (a selection control signal Vsel_r) of the selection transistor 33 is controlled so that a signal having the same waveform as that of the signal to the selection transistor 25 of the unit pixel 20 is inputted to the gate of the selection transistor 33.

Figure 3:
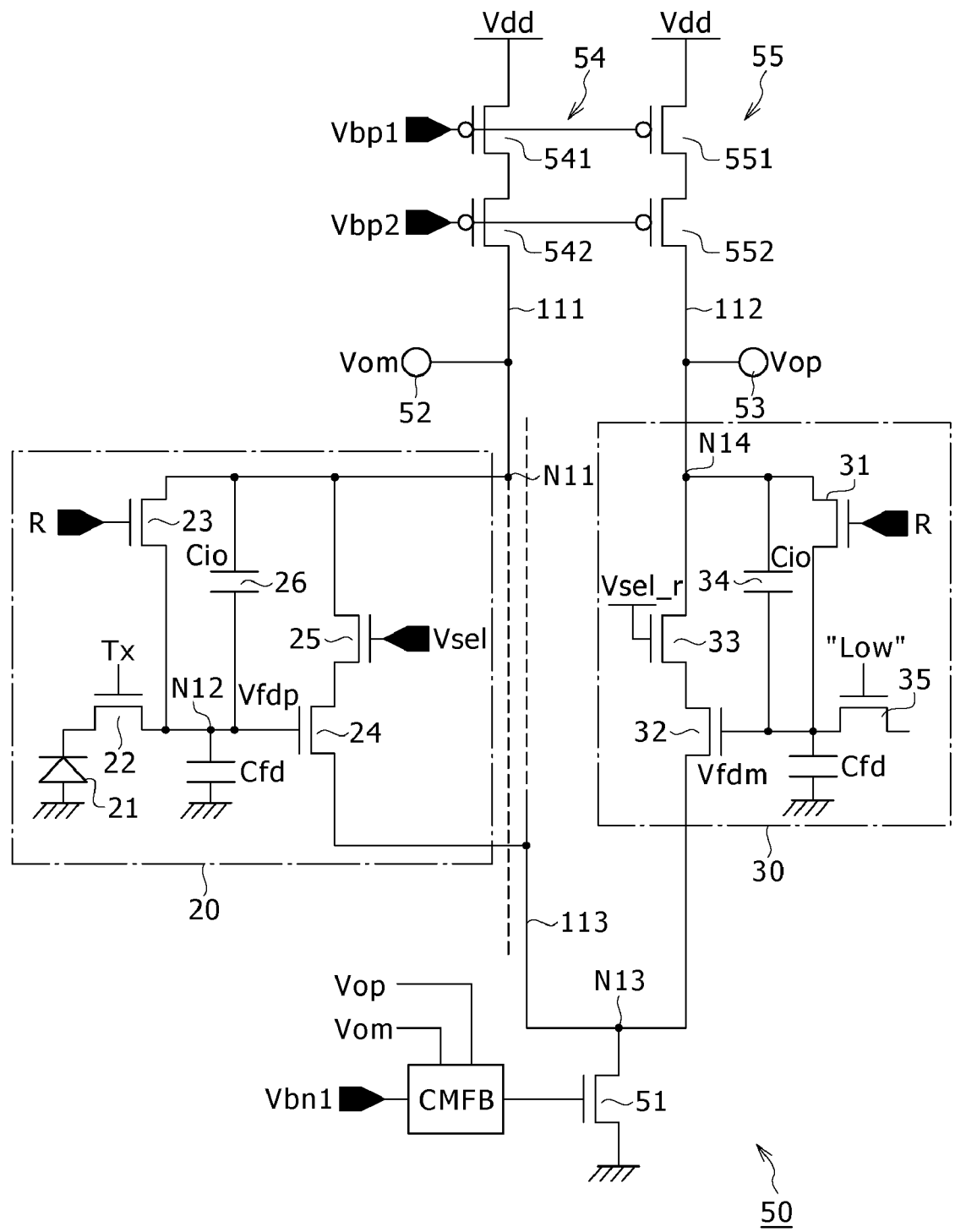
FIG. 3 is a circuit diagram showing another example of the configuration of the dummy pixel.

The dummy pixel 30 of this example includes no transistor corresponding to the transfer transistor 22 of the pixel circuit 20. As shown in FIG. 3, however, the dummy pixel 30 can also adopt a configuration of including a transfer transistor 35 corresponding to the transfer transistor 22 of the unit pixel 20. In this case, a gate potential of the transfer transistor 35 has to be fixed to a "low" level (for example, a grounding level).

In the unit pixel 20 and the dummy pixel 30 having the configurations described above, the selection control signals Vsel and Vsel_r may be digitally controlled by using a voltage at a ground level and a voltage at a Vdd level. However, adjusting the voltage values of the selection control signals Vsel and Vsel_r makes it possible to increase a gain of the pixel circuit. The selection control signals Vsel and Vsel_r are controlled so as to input the signals having the same waveform to the gate of the selection transistor 25, and the gate of the selection transistor 33, respectively.

(Differential Circuit)

The unit pixel 20 and the dummy pixel 30 constitute a differential circuit 50. A concrete configuration of the differential circuit 50 will be described in detail hereinafter.

The source electrode of the amplification transistor 24 of the unit pixel 20, and the source electrode of the amplification transistor 32 of the dummy pixel 30 are commonly connected to a common connection node N13 through the source line 113. Also, the common connection node N13 is grounded through a current source transistor 51.

Signal lines 111 and 112 through which signals are derived from the output node N11 of the unit pixel 20, and the output node N14 of the dummy pixel 30 are connected to output terminals 52 and 53, respectively. Load circuits 54 and 55 are connected between the signal line 111 and the power source Vdd, and between the signal line 112 and the power source Vdd, respectively, that is, are connected across the output terminals 52 and 53 from the unit pixel 20 and the dummy pixel 30, respectively.

The load circuit 54, for example, is composed of two-stage cascade-connected P-channel MOS transistors 541 and 542. Likewise, the load circuit 55 is composed of two-stage cascade-connected P-channel MOS transistors 551 and 552. In addition, each of gate electrodes of the P-channel MOS transistors 541 and 551 is biased by a bias voltage Vbp1. Also, each of gate electrodes of the P-channel MOS transistors 542 and 552 is biased by a bias voltage Vbp2.

Figure 4:
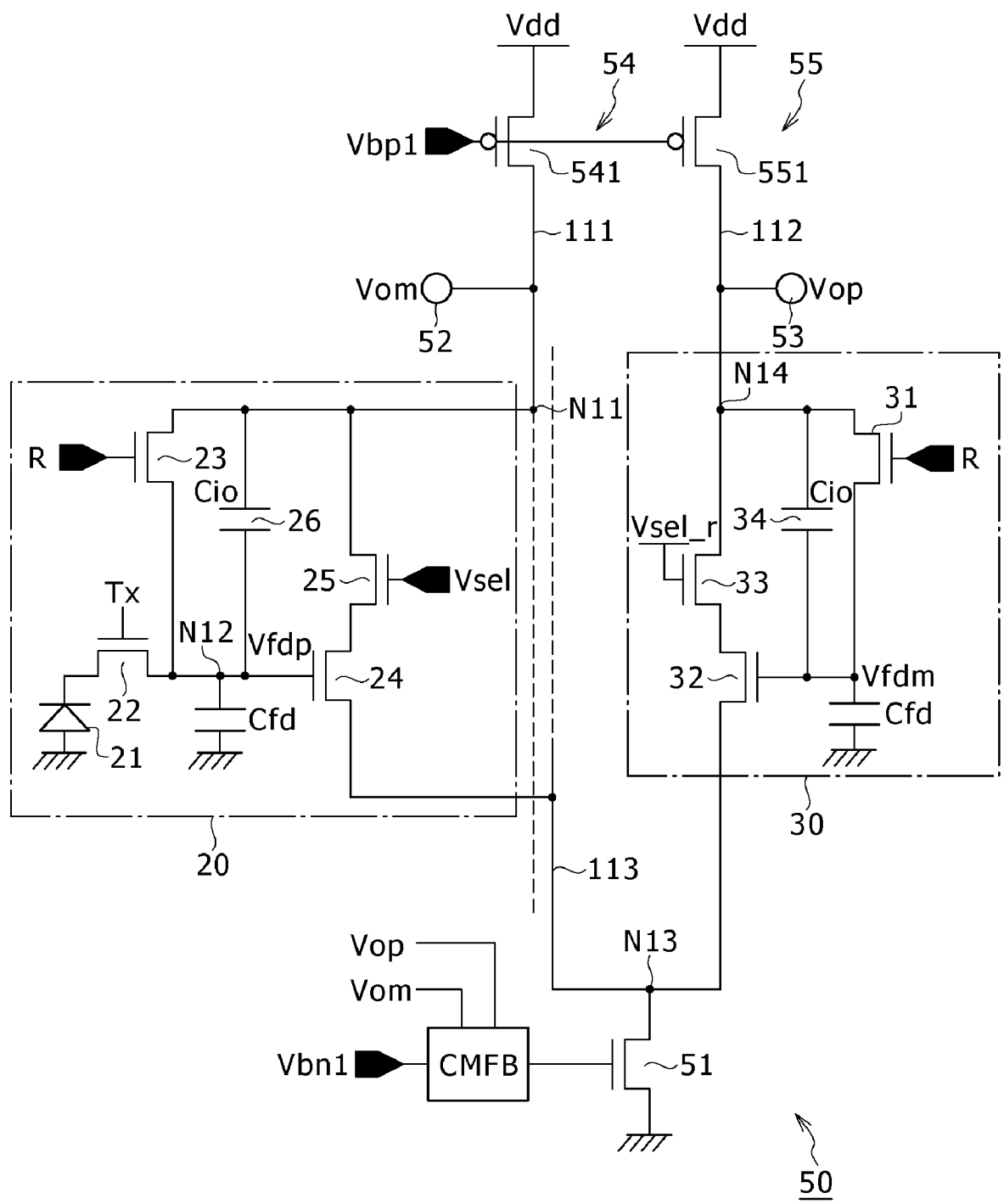
FIG. 4 is a circuit diagram showing another example of a configuration of a load circuit.

Although in this case, each of the load circuits 54 and 55 is configured in the form of the two-stage cascade-connected P-channel MOS transistors, the present invention is by no means limited thereto. That is to say, as shown in FIG. 4, the load circuits 54 and 55 may also be configured in the form of P-channel MOS transistors 541 and 551, respectively.

As described above, the differential circuit 50 is composed of the amplification transistor 24 of the unit pixel 20, the amplification transistor 32 of the dummy pixel 30, the current source transistor 51, and the load circuits 54 and 55.

In this differential circuit 50, differential outputs Vom and Vop corresponding to the gate voltage Vfpd of the amplification transistor 24 are derived from the output terminals 52 and 53, respectively, with a gate voltage Vfdm of the amplification 32 as a reference. The differential outputs Vom and Vop are supplied as a pixel signal for the unit pixel 20 to the column circuit 13.

(Common Phase Feedback Circuit)

Figure 5:
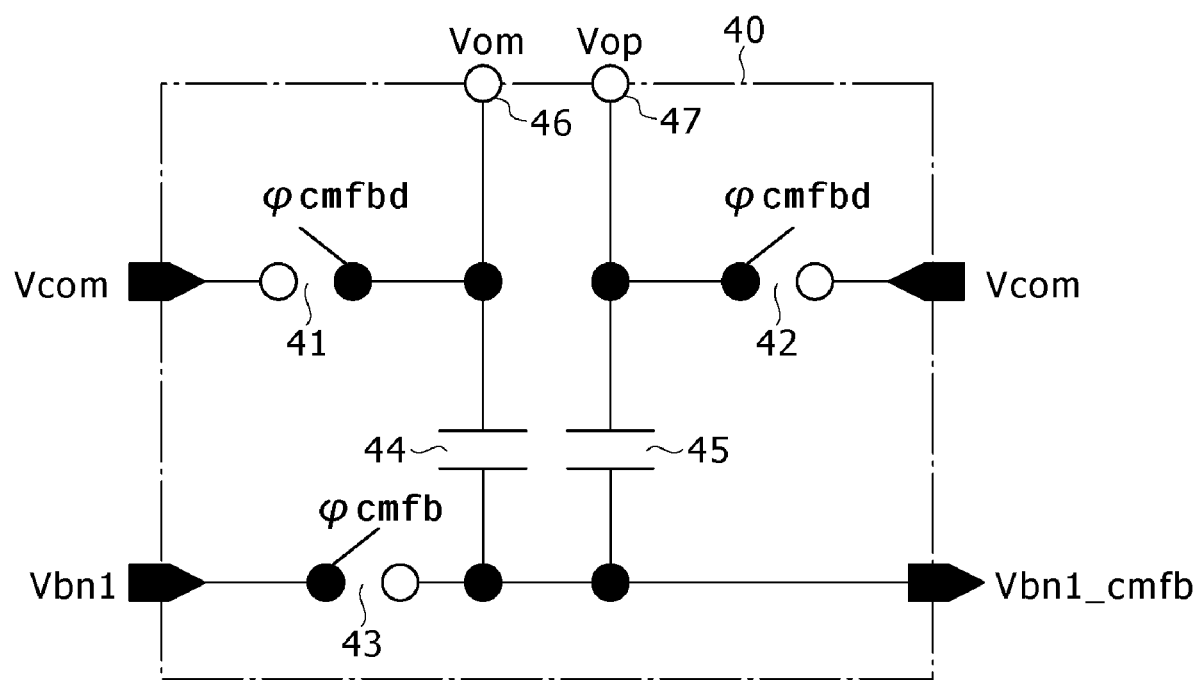
FIG. 5 is a circuit diagram showing an example of a configuration of a common phase feedback circuit.

FIG. 5 is a circuit diagram showing an example of a configuration of the common phase feedback circuit 40. An output terminal of the common phase feedback circuit 40 is connected to a gate electrode of a current source transistor 51. Thus, the common phase feedback circuit 40 carries out the control so that a center (a center of amplitude) of a difference between the differential outputs Vom and Vop becomes the control voltage Vcom by controlling a gate bias for the current source transistor 51 in accordance with the differential outputs Vom and Vop from the differential circuit 50, and the control voltage Vcom controlled by the external voltage source.

As shown in FIG. 5, the common phase feedback circuit 40 is composed of three switching elements 41 to 43, and two capacitive elements 44 and 45. Two input/output terminals 46 and 47 are connected to the output terminals 52 and 53 of the differential circuit 50, respectively.

The switching elements 41 and 42 are turned ON in response to a switch control signal φcmfbd to selectively fetch therein the control voltage Vcom from the external voltage source, thereby supplying the control voltage Vcom to each of the output terminals 52 and 53 of the differential circuit 50. The control voltage Vcom is set as a voltage value suitable for the reset when the unit pixel 20 is reset, and is set as a voltage value (CMFB voltage) at which the output amplitude of the differential circuit 50 becomes maximum at a time point when the reset of the unit pixel 20 is completed.

Here, the voltage value suitable for the reset means such a voltage value that the signal charges can be perfectly transferred from the photoelectric conversion element 21 to the floating diffusion capacitor Cfd based on a relationship between the potential of the photoelectric conversion element 21, and the potential of the floating diffusion capacitor Cfd. Adjusting the voltage value of the reset voltage makes it possible to freely set an operating point of a gate portion of the amplification transistor 24.

In addition, the voltage value (CMFB voltage) at which the output amplitude of the differential circuit 50 becomes maximum means a voltage value for regulating a level (common mode voltage) of a common mode signal of the differential circuit 50, that is, the central voltage of the difference between the differential outputs Vom and Vop. That is to say, the voltage value (CMFB voltage) means a voltage value with which the control is carried out so that the central voltage of the difference between the differential outputs Vom and Vop, for example, becomes the center of the output amplitude of the differential circuit 50.

The switching element 43 is turned ON in response to the switch control signal φcmfd to fetch therein a bias voltage Vbn1, thereby supplying the bias voltage Vbn1 as a gate bias to the current source transistor 51 of the differential circuit 50.

When the switching element 43 is in an OFF state, a bias voltage Vbn1_cmfb is supplied as a gate bias to the current source transistor 51 instead of supplying the bias voltage Vbn1. In this case, the differential circuit 50 is controlled so that the center of the amplitude of the difference between the differential outputs Vom and Vop of the differential circuit 50 becomes the control voltage Vcom (CMFB voltage) after completion of the reset of the unit pixel 20 based on the operation of the common phase feedback circuit 40 by using the bias voltage Vbn1_cmfb.

Note that, in the CMOS image sensor 10 having the configuration described above, the load circuits 54 and 55 are arranged on the common phase feedback circuit 40 side (on the upper side in FIG. 1) of the pixel array portion 11, and the differential outputs Vom and Vop are derived. However, the present invention is by no means limited thereto. That is to say, floor plan on Si chip having a configuration that the load circuits 54 and 55 are arranged on the common phase feedback circuit 40 side of the pixel array portion 11, and the differential outputs Vom and Vop are derived is arbitrary.

By adopting such a configuration, it is possible to reduce one signal line wired every pixel column, specifically, the signal line 112 on the dummy pixel 30 side. Also, it is possible to shorten the lengths of the wirings wired between the output terminals 52 and 53 of the differential circuit 50 (refer to FIG. 2), and the input/output terminals 46 and 47 of the common phase feedback circuit 40 (refer to FIG. 5). As a result, there is the advantage that it is possible to reduce a layout area of the entire pixel array portion 11.

(Operation of Pixel Array Portion)

Subsequently, operations of the unit pixel 20, the dummy pixel 30 and the common phase feedback circuit 40 in the pixel array portion 11 will be described with reference to a timing waveform chart of FIG. 6.

Firstly, at a time t1, a reset control signal R(n) having a "High" level is inputted to each of the unit pixel 20 and the dummy pixel 30 which belong to the specific pixel row n. At the same time, the switching elements 41 and 42, and the switching element 43 of the common phase feedback circuit 40 are turned ON in accordance with the switch control signal φcmfbd, and the switch control signal φcmfb, respectively.

Concurrently with this operation, the control voltage Vcom for regulating a level of the common mode signal for the differential circuit 50 is inputted as the reset voltage for the unit pixel 20 from the external voltage source to the common phase feedback circuit 40. That is to say, the external voltage source and the common phase feedback circuit 40 constitute to a reset voltage supplying section for supplying the reset voltage to the reset transistor 23 through the output node N11.

In this case, the control voltage Vcom is used as the reset voltage for the unit pixel 20. However, it is also possible to adopt such a configuration that a reset voltage supplying section composed of a signal line and a switching element dedicated to a reset operation is specially prepared, and a reset voltage is suitably inputted in parallel with the control voltage Vcom from the reset voltage supplying section concerned.

However, adoption of a configuration that the common phase feedback circuit 40 is used as the reset voltage supplying section as well offers an advantage that the circuit configuration can be simplified all the more because there is no necessary for specially preparing the reset voltage supplying section.

The reset control signal R(n) is gradually changed from the "High" level to the "Low" level at a time point t2 when the node potential of the floating diffusion capacitor Cfd as the signal detecting portion of the unit pixel 20 is set at the reset voltage for the control voltage Vcom based on the reset operation made in accordance with the reset control signal R(n). This operation applies to the dummy pixel 30.

After the reset control signal R(n) has become the "Low" level, at a time t3, the selection control signal Vsel(n) having the "High" level is inputted to turn each of the selection transistors 25 of the unit pixels 20 belonging to the pixel row n, thereby setting each of the unit pixels 20 in the selection state.

Here, the selection control signal Vsel(n) may be inputted concurrently with the reset control signal R(n). However, not inputting the selection control signal Vsel(n) concurrently with the reset control signal R(n) is advantageous in terms of suppression of the power consumption in the unit pixel 20 because the power can be reduced by the power consumed with turn-ON of the selection transistor 25 for a period of time from the time t1 to the time t3.

Concurrently with the input of the selection control signal Vsel(n) or in and after that input, the control voltage Vcom is set as a voltage value at which the output amplitude of the differential circuit 50 is obtained to a maximum extent. After that, the switch control signal φcmfb is set in a non-active state (at the "Low" level) at a time t4, and subsequently the switch control signal φcmfbd is set in a non-active state at a time t5.

At this time, an operation for reading out the voltage of the floating diffusion capacitor Cfd set at the reset voltage for the control voltage Vcom in the form of the reset level, and supplying that voltage to the column circuit 13 in the subsequent stage is carried out in the unit pixel 20.

Next, at a time t6, a transfer control signal T(n) is inputted to turn ON the transfer transistor 23, thereby transferring the signal charges which have been accumulated through the photoelectric conversion in the photoelectric conversion element 21 until that time to the floating diffusion capacitor Cfd. Also, at a time t6 when the transfer control signal T(n) disappears, the voltage corresponding to the signal charges thus transferred is read out in the form of a signal having a predetermined level, and is then supplied to the column circuit 13 in the subsequent stage.

The capacitive element 26 connected between the floating diffusion capacitor Cfd and the signal line 111, and the common source configuration amplification transistor 24 play the operation for reading out the reset level and the signal level in the unit pixel 20. The capacitive element 26 has a minuter capacitance than that of the floating diffusion capacitor Cfd. Therefore, the level of the outputted voltage is high, that is, the signal detection sensitivity is high in the unit pixel 20 which carries out the operation for reading out the signal by using the capacitive element 26 having the minute capacitance, and the common source configuration amplification transistor 24.

OPERATION AND EFFECT OF THE PRESENT INVENTION

As has been described so far, the transfer transistor 22 for transferring the signal charges obtained through the photoelectric conversion in the photoelectric conversion element 21 to the floating diffusion capacitor Cfd is provided in the unit pixel 20 in which the signal detection sensitivity is enhanced by reading out the signal by using the common source type amplification transistor 24, and the capacitive element 26 having the minute capacitance. As a result, the pixel 20 is firstly reset and the reset level is read out, and thereafter the signal charges are transferred from the photoelectric conversion element 21 to the floating diffusion capacitor Cfd, and are read out in the form of the signal having the predetermined level, thereby, for example, removing the noise due to the correlated double sampling in the column circuit 13. Consequently, it is possible to suppress both the reset noise and the fixed pattern noise.

In addition, the differential circuit 50 is composed of the unit pixel 20 and the dummy pixel 30, and the reading-out circuit for reading out the reset level and the signal level from the unit pixel 20 is configured in the form of the differential circuit. Also, there is provided the reset voltage supplying section (composed of the external voltage source and the common phase feedback circuit 40 in this example) for supplying the reset voltage to the reset transistor 23 through the output node N11 of the pixel 20, and making the voltage of the reset voltage variable. As a result, the potential of the floating diffusion capacitor Cfd can be freely set by adjusting the voltage value of the reset voltage. Consequently, the potential design for the unit pixel 20 can be readily carried out, and the perfect transfer of the signal charges from the photoelectric conversion element 21 to the floating diffusion capacitor Cfd becomes possible.

However, when the voltage value of the reset voltage on the unit pixel 20 side (on the positive phase) is adjusted, the central voltage of the difference between the differential outputs Vom and Vop deviates from the output amplitude in the differential circuit 50. In order to cope with this situation, there is adopted such a configuration that the common phase feedback circuit 40 for controlling the gate bias for the current source transistor 51 of the differential circuit 50 is provided, and the feedback control is carried out by setting the voltage value (CMFB voltage) of the control voltage Vcom so that after the node potential of the floating diffusion capacitor Cfd of the unit pixel 20 is reset by the reset voltage, the central voltage of the difference between the differential outputs Vom and Vop becomes the center of the output amplitude in the differential circuit 50 based on the operation of the common phase feedback circuit 40. As a result, the operating point of the gate portion of the amplification transistor 24 can be set so that the output amplitude (output range) becomes maximum. Consequently, it is possible to widen the dynamic range.

(Dispersion in Characteristics of Differential Circuit)

Here, in the unit pixel 20 of this embodiment, when a dispersion in characteristics occurs on each of the unit pixel 20 side and the dummy pixel side 30 of the differential circuit 50 due to size mismatch or the like, the dispersion in characteristics may exert an influence on the output characteristics of the output signal.

FIGS. 7A to 7C show output waveforms when there is a dispersion in characteristics (error) on each of the unit pixel 20 side and on the dummy pixel 30 side. In these figures, reference symbol Cfd_L designates a capacitance of the floating diffusion capacitor on the unit pixel 20 side, reference symbol Cio_L designates a capacitance of the capacitive element 26, reference symbol Cfd_R designates a capacitance of the floating diffusion capacitor Cfd on the dummy pixel 30 side, and reference symbol Cio_R designates a capacitance of the capacitive element 34.

When the capacitance Cio_L of the capacitive element 26 and the capacitance Cfd_L of the floating diffusion capacitor Cfd on the unit pixel 20 side are smaller than the capacitance Cio_R of the capacitive element 34, and the capacitance Cfd_R of the floating diffusion capacitor Cfd on the dummy pixel 30 side, respectively, the reset levels of the unit pixel 20 and the dummy pixel 30 are not identical to each other, but are shifted from each other as shown in FIG. 7A. In this connection, when an error occurs on none of the unit pixel 20 side and the dummy pixel 30 side, as shown in FIG. 7B, the reset levels of the unit pixel 20 and the dummy pixel 30 agree with each other.

Thus, the characteristics that the reset levels of the unit pixel 20 and the dummy pixel 30 change due to the difference between the capacitance Cio_L of the capacitive element 26 on the unit pixel 20 side and the capacitance Cio_R of the capacitive element 34 on the dummy pixel 30 side, and the difference between the capacitance Cfd_L of the floating diffusion capacitor Cfd on the unit pixel 20 side and the capacitance Cfd_R of the floating diffusion capacitor Cfd on the dummy pixel 30 side are conversely utilized. That is to say, the dummy pixel 30 side is intentionally designed to be larger in size than the unit pixel 20 side so that the capacitance Cio_L of the capacitive element 26 and the capacitance Cfd_L of the floating diffusion capacitor Cfd on the unit pixel 20 side are larger than the capacitance Cio_R of the capacitive element 34, and the capacitance Cfd_R of the floating diffusion capacitor Cfd on the dummy pixel 30 side, respectively, which results in that as shown in FIG. 7C, it is possible to widen the amplitude ranges of the differential outputs Vom and Vop.

(Dispersion in Sensitivity)

Likewise, since the capacitance Cio of the capacitive element 26 for detecting the signal is minute, a dispersion in sensitivity occurs every unit pixel 20. Correction coefficients for correction of the dispersion in characteristics can be obtained in the form of inverse numbers of the outputs from the pixels 20 when the same input is applied to the pixels 20.

With regard to a first method of applying the same input to the unit pixels 20 to obtain the correction coefficients, a light is uniformly radiated to all the unit pixels 20, and the inverse numbers of the outputs from the unit pixels 20 at that time are obtained, thereby making it possible to obtain the correction coefficients for all the unit pixels 20, respectively. With regard to a second method, the voltage value of the transfer control signal Tx is set so as to gradually increase, and the signal charges generated in the photoelectric conversion element 21 are transferred in plural batches (partial transfer), thereby making it possible to obtain the correction coefficients.

<Calculation of Correction Coefficients>

Figure 8:
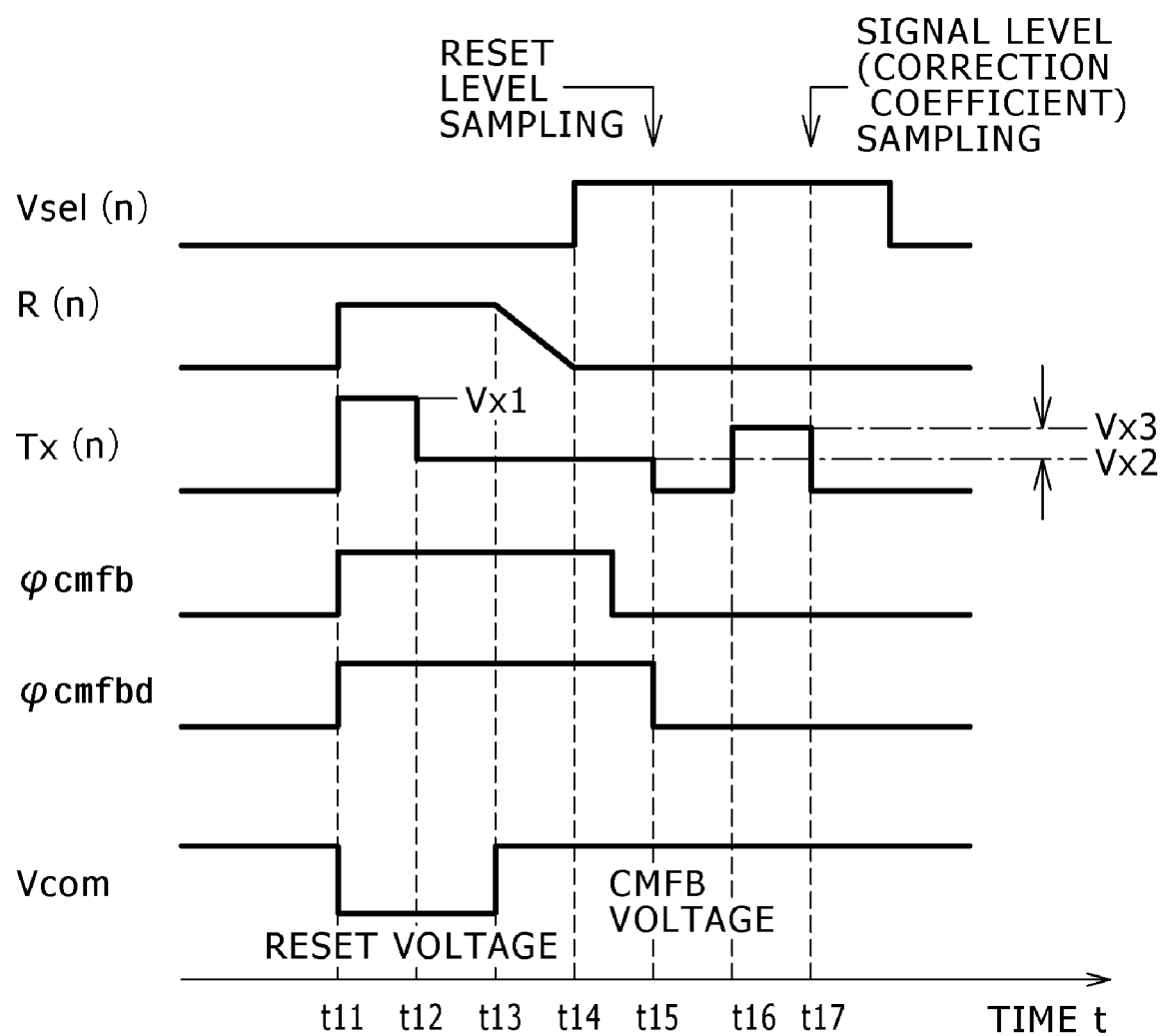
FIG. 8 is a timing waveform chart explaining a method of obtaining correction coefficients for a dispersion in sensitivity.
Figure 9:
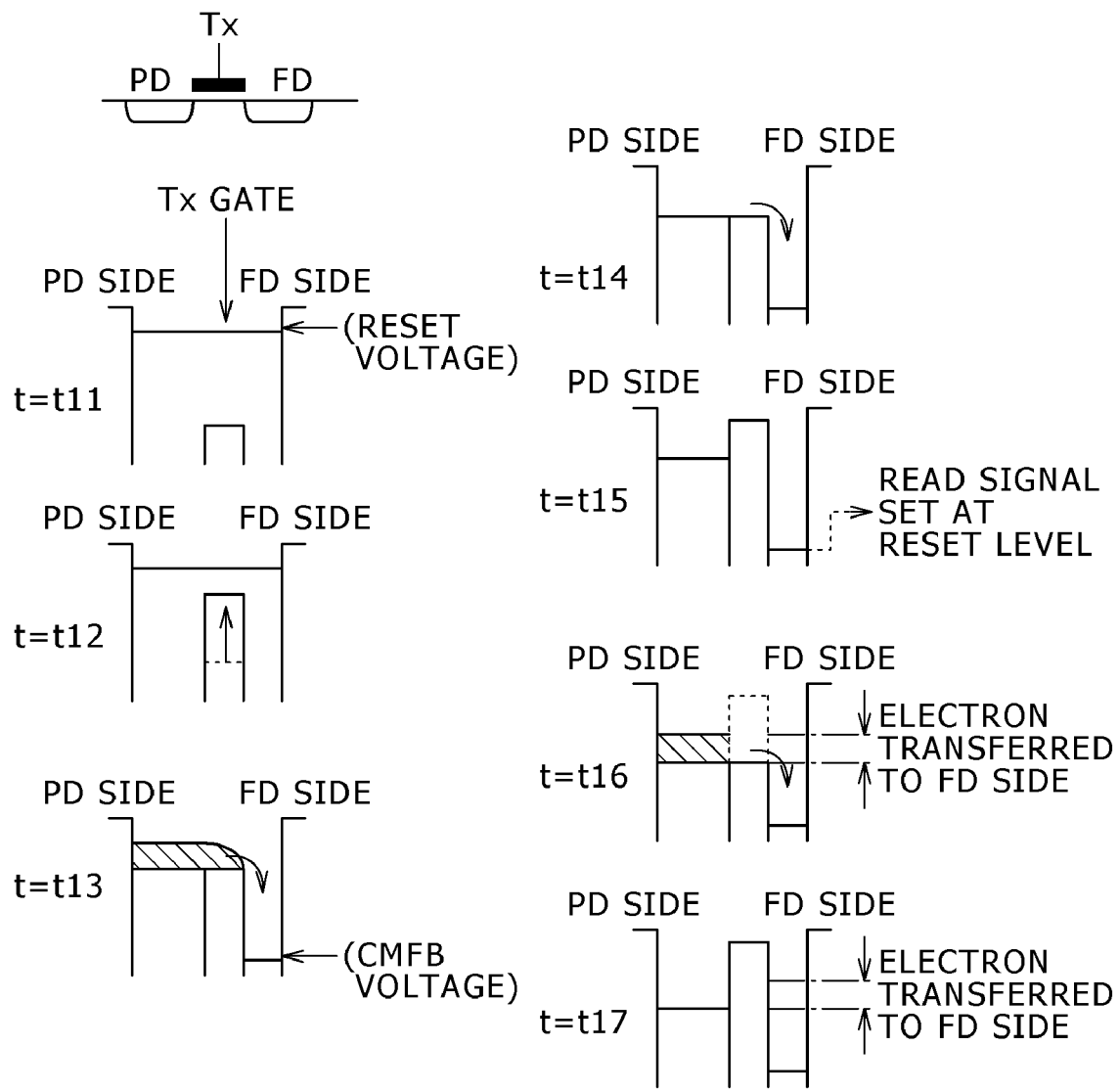
FIG. 9 is an energy diagram explaining the method of obtaining the correction coefficients for the dispersion in sensitivity.
Figure 10:
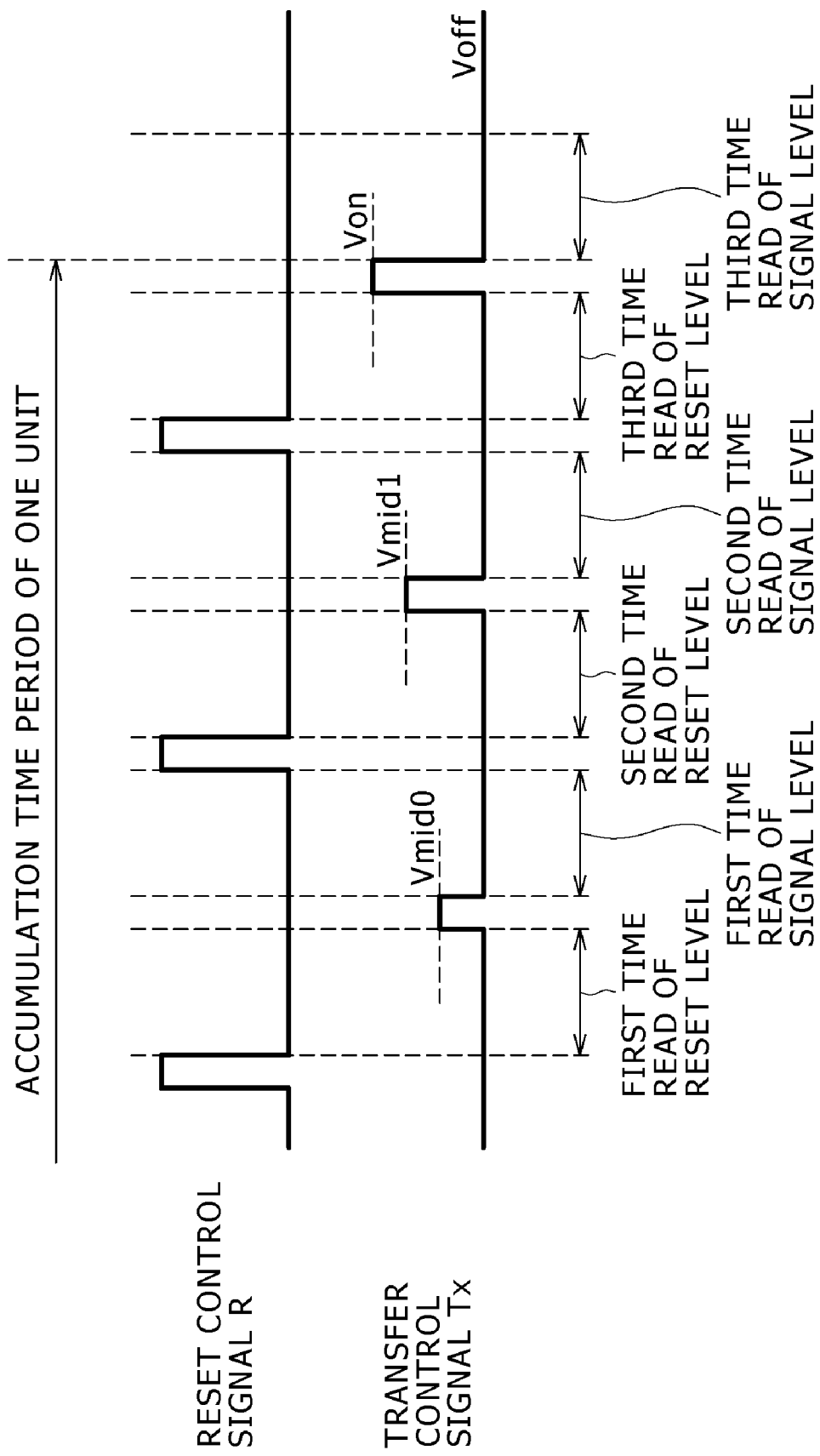
FIG. 10 is a timing chart showing an example of a drive timing in the case of tripartition transfer basis.

Here, the second method of obtaining the correction coefficients for the dispersion in sensitivity will be concretely described with reference to a timing waveform chart of FIG. 8, and an energy diagram of FIG. 9.

Firstly, for example, a voltage is applied from the outside to the photoelectric conversion element (PD) 21, thereby filling the photoelectric conversion element 21 with charges (electrons in this example). After that, at a time t11, the reset control signal R(n) having the "High" level is inputted to each of the unit pixel 20 and the dummy pixel 30 belonging to the specific pixel row n. At the same time, the transfer control signal Tx(n) is set at a voltage value Vx1 with which the charges accumulated in the photoelectric conversion element 21 can be perfectly transferred to the floating diffusion capacitor Cfd.

Concurrently with this operation, all the switching elements 41 and 42, and the switching element 43 of the common phase feedback circuit 40 are turned ON in accordance with the switch control signal φcmfbd, and the switch control signal φcmfb, respectively. Also, the control voltage Vcom inputted to the common phase feedback circuit 40 is set at the reset voltage.

Next, at a time t12, the transfer control signal Tx(n) is set at a voltage value Vx2 with which the charges in the photoelectric conversion element 21 can not be perfectly transferred, but a small quantity of charges can be transferred from the photoelectric conversion elements 21 of all the pixels 20 in the pixel array portion 11.

Next, at a time t13, the voltage on the floating diffusion capacitor (FD) Cfd side, that is, the control voltage Vcom is set at the high voltage (CMFB voltage), and the potential of the floating diffusion capacitor Cfd is lowered. As a result, the charges corresponding to a so-called leveling-off voltage or more which is set at a potential of a channel right under the gate of the transfer transistor 22 are transferred from the photoelectric conversion element 21 to the floating diffusion capacitor Cfd.

Next, after the reset control signal R(n) has become a "Low" level, at a time t14, the selection control signal Vsel(n) having a "High" level is inputted to turn ON the selection transistors 25 of the unit pixels 20 belonging to the pixel row n. As a result, each of the unit pixels 20 are set in a selection state, thereby performing the setting for the reading-out operation.

Also, at a time t15, the transfer control signal Tx(n) is set at a "Low" level. Thus, the voltage of the floating diffusion capacitor Cfd corresponding to the charges transferred at the voltage Vx2 of the transfer control signal Tx(n) is set at a reset level (signal reference level) to be read out to the outside.

Next, at a time t16, the transfer control signal Tx(n) is set at a given voltage value Vx3 (higher than the first leveling-off voltage value Vx2) not permitting the perfect transfer. Also, at a time t17, the transfer control signal Tx(n) is set at a "Low" level, and the voltage of the floating diffusion capacitor Cfd corresponding to the charged transferred at the voltage value Vx3 of the transfer control signal Tx(n) is read out in the form of a signal level to the outside.

This signal level is ideally based on the same quality of charges for the pixels. Thus, if there is no dispersion in sensitivity, the same pixel signal is outputted from all the pixels by performing the correlated double sampling at the read-out signal level and at the reset level. However, the pixel signals are influenced by the dispersion in sensitivity in the unit pixels 20. As a result, a dispersion occurs in the pixel signals among the pixels.

In order to cope with this situation, the voltage value of the transfer control signal Tx is set so as to gradually increase. The signal charges generated in the photoelectric conversion element 21 are transferred in plural batches. The inverse numbers of the output signals from the unit pixels 20 in the phase of the charge transfer other than the first time charge transfer are used as the correction coefficients, respectively. Thus, the correction processing is executed for the output signals by using the correction coefficients, thereby making it possible to correct the dispersion in sensitivity in the pixels. Note that, it is preferable that average values of the output signals from the unit pixels 20 in the phase of the charge transfer other than the first time charge transfer are obtained and are used as the correction coefficients because the noises are contained when the reading-out operation is merely carried out once.

(Saturation of Output Signal)

The unit pixel 20 of this embodiment, that is, the unit pixel 20 which reads out the signal by using the capacitive element 26 having the minute capacitance, and the common source configuration amplification transistor 24 has the sensitivity which is higher about one order of magnitude than that in the case of the source follower read-out in the related art. For this reason, the output signal from the pixel 20 may be saturated with a small quantity of charges.

The problem that the output signal is saturated can be solved as follows. That is to say, the method of partitioning the unit pixel 20 which is utilized in correcting the above dispersion in sensitivity, that is, the driving method of transferring the signal charges obtained through the photoelectric conversion in the photoelectric conversion element 21 with those signal charges being divided into plural parts each corresponding to an arbitrary quantity of charges, and reading out the signals corresponding to the charges obtained on the partition transfer basis is used. Also, the signals read out by utilizing this driving method are added to one another into one pixel signal, thereby allowing the problem described above to be solved.

The driving method of transferring the signal charges with those signal charges being partitioned into plural parts each corresponding to the arbitrary quantity of charges, and reading out the signals corresponding to the charges obtained on the partition transfer basis will be more concretely described hereinafter by giving, as an example, the case where the signal charges accumulated in the photoelectric conversion element 21 during a accumulation period of time of one unit, for example, are transferred on a tripartition transfer basis.

In the case of the tripartition transfer basis, an ON voltage Von at which the charges in the photoelectric conversion element 21 can be perfectly transferred, an OFF voltage Voff at a "Low" level, and two intermediate voltages Vmid0 and Vmid1 each of which is higher than the OFF voltage Voff, and lower than the ON voltage Von are set for the transfer control signal Tx which is applied to the gate electrode of the transfer transistor 22.

Also, the intermediate voltages Vmid0 and Vmid1, and the ON voltage Von are successively applied as the transfer control signal Tx in this order to the gate electrode of the transfer transistor 22. The signal charges accumulated in the photoelectric conversion element 21 during the accumulation period of time of one unit are transferred to the floating diffusion capacitor Cfd on the tripartition transfer basis. Also, the signals outputted from the respective unit pixels 20 in correspondence to the tripartition transfer basis, for example, are addition-processed in the column circuit 13 or a signal processing circuit (not shown) in the subsequent stage.

As has been described above, the unit pixels 20 are driven by utilizing the driving method based on the partition transfer basis, and the signals outputted from the respective unit pixels 20 on the partition transfer basis are added to one another into one pixel signal. As a result, the high-sensitivity image sensor can be realized because the signals can be read out from the respective unit pixels 20 at the high signal detection sensitivity without impairing the saturated level.

(Pixel Sharing)

Figure 11:
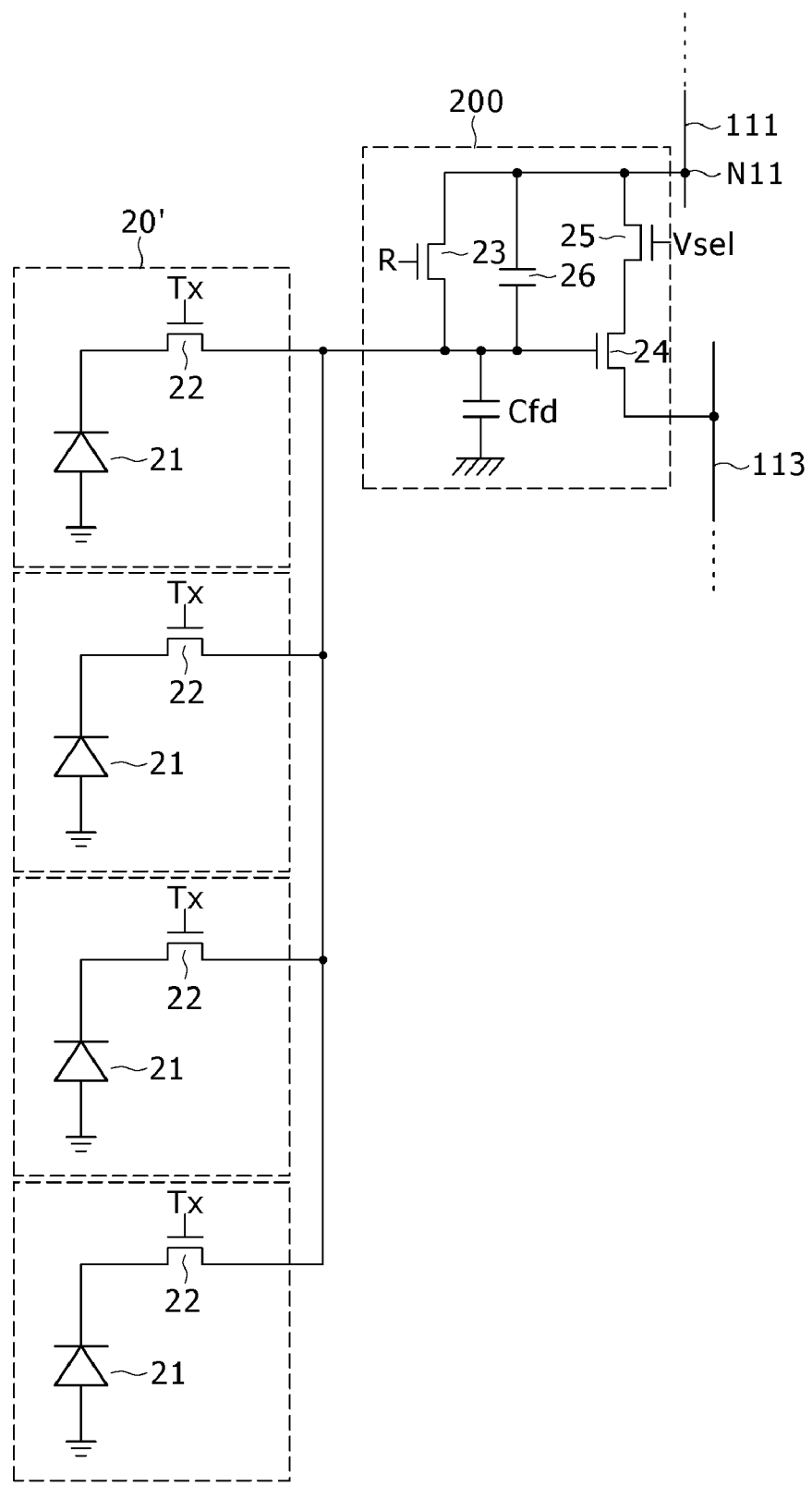
FIG. 11 is a circuit diagram showing an example of pixel sharing.

The unit pixel 20 of this embodiment which has been described so far has the less reduction in sensitivity. Therefore, it is possible to adopt a configuration such that as shown in FIG. 11, a unit pixel 20' is composed of the photoelectric conversion element 21 and the transfer transistor 22, a plurality of unit pixels 20' are arranged in parallel, and a signal detecting circuit 200 composed of the reset transistor 23, the amplification transistor 24, the selection transistor 25, and the capacitive element 26 are shared among a plurality of unit pixels 20'. Since the pixel sharing results in a parasitic capacity of a read line being reduced, a signal reading speed can be increased.

In particular, the reading-out circuit is configured in the form of a differential form, which results in that when an ideal amplification factor of the differential circuit 50 is obtained, the signal can be detected without depending on the floating diffusion capacitor Cfd. Therefore, as shown in FIG. 11, when the photoelectric conversion element 21 and the transfer transistor 22 are provided in parallel in the pixel circuit, the signal can be read out without reducing the voltage sensitivity.

In this connection, the reading operation with the normal pixel configuration depends on the floating diffusion capacitor Cfd, and the floating diffusion capacitor Cfd increases when a plurality of photoelectric conversion elements 21 and a plurality of transfer transistors 22 are provided in the pixels. As a result, the sensitivity is reduced accordingly.

In the unit pixel 20 as well of this embodiment, although the floating diffusion capacitor Cfd similarly increases, the sensitivity of detecting the signal voltage consistently depends on the capacitance at the node N12 and the capacitance at the output node N11 of the floating diffusion capacitor Cfd. Therefore, increasing the parallelism of the pixels hardly exerts an influence on the sensitivity. In addition, an increase in parallelism results in that the number of diffusion layers of the amplification transistor 24 decreases. Therefore, it is possible to reduce the parasitic capacitance parasitic on the read line, which can contribute to an increase in speed of reading out the signal.

MODIFICATIONS

Note that, in the embodiment described above, the present invention has been described by giving, as an example, the case where the present invention is applied to the CMOS image sensor in which the unit pixels each serving to detect the signal charges corresponding to a quantity of visible light in the form of a physical quantity are arranged in matrix. However, the present invention is by no means limited to the application to the CMOS image sensor. That is to say, the present invention can be applied to the general solid-state image pickup devices each using the column system in which the column circuit is arranged every pixel column of the pixel array portion.

In addition, the present invention is by no means limited to the application to the image pickup device for detecting a distribution of a quantity of incident visible light to capture the distribution thereof in the form of an image. That is to say, the present invention can be applied to all the solid-state image pickup device for detecting a distribution of a quantity of incident infrared rays, X-rays, particles or the like to capture the distribution thereof in the form of an image, and the solid-state image pickup device (physical quantity distribution detecting device), such as a fingerprint detecting sensor, for detecting a distribution of other physical quantity such as a pressure or an electrostatic capacitance in a broad sense to capture the distribution thereof in the form of an image.

Moreover, the present invention is by no means limited to the solid-state image pickup device for reading out the pixel signals from the respective unit pixels by successively scanning the unit pixels of the pixel array portion in rows. That is to say, the present invention can also be applied to an X-Y address type solid-state image pickup device for selecting arbitrary pixels in pixels, and reading out the signals from the respective pixels thus selected in pixels.

It is noted that the solid-state image pickup device may have a form of being formed as one chip, or may have a module form, having an image pickup function, in which an image pickup portion, and a signal processing portion or an optical system are collectively packaged.

In addition, the present invention can be applied to an image pickup apparatus as well as to the solid-state image pickup device. Here, the image pickup apparatus means a camera system such as a digital still camera or a video camera, or an electronic apparatus, having an image pickup function, such as a mobile phone. It is noted that the image pickup apparatus also means the above module form mounted to the electronic apparatus, that is, a camera module in some cases.

[Image Pickup Apparatus]

FIG. 12 is a block diagram showing a configuration of an image pickup apparatus according to an embodiment of the present invention. As shown in FIG. 12, the image pickup apparatus 60 according to the embodiment of the present invention includes an optical system having a lens group 61, a solid-state image pickup device 62, a DSP circuit 63 as a camera signal processing circuit, a frame memory 64, a display device 65, a recording device 66, a manipulation system 67 and a power source system 68. Also, the DSP circuit 63, the frame memory 64, the display device 65, the recording device 66, the manipulation system 67, and the power source system 68 are connected to one another through a bus line 69.

The lens group 61 captures an incident light (image light) from a subject to focus the incident light onto an imaging area of the solid-state image pickup device 62. The solid-state image pickup device 62 converts a quantity of incident light focused onto the imaging area by the lens group 61 into electrical signals in pixels and outputs the electrical signals in the form of pixel signals. The CMOS image sensor 10 of the embodiment described above is used as the solid-state image pickup device 62.

The display device 65 is constituted by a panel type display device such as a liquid crystal display device or an organic electro luminescence (EL) display device. The display device 65 displays thereon a moving image or a still image captured by the solid-state image pickup device 62. The recording device 66 records image data on the moving image or the still image captured by the solid-state image pickup device 62 in a recording medium such as a video tape or a digital versatile disk (DVD).

The manipulation system 67 issues manipulation commands about the various functions which the image pickup apparatus of this embodiment has under the manipulation made by a user. The power source system 68 suitably supplies the various power sources becoming the operation power sources for the DSP circuit 63, the frame memory 64, the display device 65, the recording device 66, and the manipulation system 67 to those objects of power supply, respectively.

As has been described so far, in the image pickup apparatus, such as the camera module, for the video camera or the digital still camera, or the mobile apparatus such as the mobile phone, the CMOS image sensor 10 of the embodiment described above is used as the solid-state image pickup device 62 thereof, which results in that since the pixel signal having the sufficient magnitude can be obtained even with a less quantity of signal charges in the CMOS image sensor 10 concerned, the high-sensitivity image pickup apparatus can be realized.

It should be understood by those skilled in the art that various modifications, combinations, sub-combinations and alterations may occur depending on design requirements and other factors insofar as they are within the scope of the appended claims or the equivalents thereof.

What is claimed is:

1. A signal processing method for a solid-state image pickup device including a pixel array portion constituted by arranging unit pixels each including a photoelectric conversion element, a transfer transistor for transferring signal charges obtained through photoelectric conversion in said photoelectric conversion element to a floating diffusion capacitor, a reset transistor connected between said floating diffusion capacitor and an output node, a capacitive element having a minuter capacitance than that of said floating diffusion capacitor, said capacitive element being connected between said floating diffusion capacitor and said output node, and an amplification transistor for reading out a voltage signal obtained through conversion in said capacitive element; a dummy pixel having characteristics equal to those of said unit pixel, said dummy pixel being provided every pixel column of said pixel array portion; and a differential circuit composed of said unit pixel and said dummy pixel, said signal processing method comprising the steps of:

obtaining inverse numbers of outputs from said unit pixels when the same input is given to said unit pixels of said pixel array portion in a form of correction coefficients; and correcting a dispersion in sensitivity among said pixels by using the correction coefficients.

2. The signal processing method for a solid-state image pickup device according to claim 1, further comprising the steps of:

uniformly radiating a light to said pixels of said pixel array portion in obtaining the correction coefficients; and setting the inverse numbers of the outputs from said unit pixels as the correction coefficients.

3. The signal processing method for a solid-state image pickup device according to claim 1, further comprising the steps of:

setting a voltage value of a transfer control signal, in accordance with which said transfer transistor is driven, so as to gradually increase the voltage value thereof in obtaining the correction coefficients;

transferring the signal charges generated in said photoelectric conversion element in plural batches; and setting the inverse numbers of the outputs from said unit pixels in a phase of charge transfer other than a first time charge transfer as the correction coefficients.

4. The signal processing method for a solid-state image pickup device according to claim 3, wherein inverse numbers of average values of the outputs from said unit pixels in the phase of the charge transfer other than the first time charge transfer are set as the correction coefficients.

5. A signal processing method for a solid-state image pickup device including a pixel array portion constituted by arranging unit pixels each including a photoelectric conversion element, a transfer transistor for transferring signal charges obtained through photoelectric conversion in said photoelectric conversion element to a floating diffusion capacitor, a reset transistor connected between said floating diffusion capacitor and an output node, a capacitive element having a minuter capacitance than that of said floating diffusion capacitor, said capacitive element being connected between said floating diffusion capacitor and said output node, and an amplification transistor for reading out a voltage signal obtained through conversion in said capacitive element; a dummy pixel having characteristics equal to those of said unit pixel, said dummy pixel being provided every pixel column of said pixel array portion; and a differential circuit composed of said unit pixel and said dummy pixel, said signal processing method comprising the steps of:

gradually increasing a voltage value of a transfer control signal in accordance with which said transfer transistor is driven, and transferring the signal charges generated in said photoelectric conversion element for a accumulation period of time of one unit in plural batches; and adding the signals outputted from said unit pixels by plural transfer operations.

* * * * *